US012765061B2

(12) United States Patent
Zhan

(10) Patent No.: US 12,765,061 B2
(45) Date of Patent: Oct. 13, 2026

(54) DRIVING SUBSTRATES AND DISPLAY PANELS

(71) Applicant: Shenzhen China Star Optoelectronics Semiconductor Display Technology Co., Ltd., Shenzhen (CN)

(72) Inventor: Xiaojun Zhan, Shenzhen (CN)

(73) Assignee: Shenzhen China Star Optoelectronics Semiconductor Display Technology Co., Ltd, Shenzhen (CN)

( * ) Notice: Subject to any disclaimer, the term of this patent is extended or adjusted under 35 U.S.C. 154(b) by 475 days.

(21) Appl. No.: 18/263,533

(22) PCT Filed: Jun. 29, 2023

(86) PCT No.: PCT/CN2023/104223
§ 371 (c)(1),
(2) Date: Jul. 30, 2023

(87) PCT Pub. No.: WO2024/254908
PCT Pub. Date: Dec. 19, 2024

(65) Prior Publication Data

US 2025/0089362 A1 Mar. 13, 2025

(30) Foreign Application Priority Data

Jun. 14, 2023 (CN) ......................... 202310700987.7

(51) Int. Cl.
*H10D 86/60* (2025.01)
*H10D 86/40* (2025.01)
*H10W 90/00* (2026.01)

(52) U.S. Cl.
CPC ........... *H10D 86/60* (2025.01); *H10D 86/441* (2025.01); *H10W 90/00* (2026.01)

(58) Field of Classification Search
CPC .... H10D 86/60; H10D 86/441; H10D 30/673; H10D 86/421; H10W 90/00
See application file for complete search history.

(56) References Cited

U.S. PATENT DOCUMENTS 10,340,365 B2 * 7/2019 Lu ...................... H10D 30/0314
12,224,354 B2 * 2/2025 Ding .................... H10D 86/423
(Continued)

FOREIGN PATENT DOCUMENTS

CN 1564313 A 1/2005
CN 104900712 A 9/2015
(Continued)

OTHER PUBLICATIONS

German Office Action issued in corresponding German Patent Application No. 11 2023 000 066.2 dated May 23, 2025, pp. 1-8.
(Continued)

*Primary Examiner* — Tan N Tran
(74) *Attorney, Agent, or Firm* — PV IP PC; Peter Stecher; Wei Te Chung

(57) ABSTRACT

Embodiments of the present disclosure provide a driving substrate and a display panel, in which a transition part of an active layer is disposed between a first contact part and a channel of the active layer, a first part of a gate is disposed overlapping with the channel and used to block doped ions completely, a second part of the gate is disposed overlapping with the transition part and used to penetrate part of the doped ions; and a first electrode is connected to the first contact part, and a second electrode is connected to a second contact part.

20 Claims, 4 Drawing Sheets

(56) References Cited

U.S. PATENT DOCUMENTS

| | | | | |
|---|---|---|---|---|
| 12,224,356 | B2 * | 2/2025 | Ohta | H10D 30/6757 |
| 2002/0192931 | A1 * | 12/2002 | Hayakawa | H10D 30/0314 257/E21.336 |
| 2023/0155031 | A1 | 5/2023 | Ding | |

FOREIGN PATENT DOCUMENTS

| | | | |
|---|---|---|---|
| CN | 105810573 | A | 7/2016 |
| CN | 112599606 | A | 4/2021 |
| CN | 115411114 | A | 11/2022 |
| KR | 20040072826 | A | 8/2004 |
| WO | 2017156808 | A1 | 9/2017 |

OTHER PUBLICATIONS

Chinese Office Action issued in corresponding Chinese Patent Application No. 202310700987.7 dated Nov. 14, 2023, pp. 1-7.
Chinese Office Action issued in corresponding Chinese Patent Application No. 202310700987.7 dated Dec. 15, 2023, pp. 1-6.
Chinese Decision of Rejection issued in corresponding Chinese Patent Application No. 202310700987.7 dated Jan. 2, 2024, pp. 1-6.
International Search Report in International application No. PCT/CN2023/104223, mailed on Feb. 8, 2024.
Written Opinion of the International Search Authority in International application No. PCT/CN2023/104223, mailed on Feb. 8, 2024.
India Office Action issued in corresponding India Patent Application No. 202317079997 dated Jul. 1, 2026, pp. 1-6.

* cited by examiner

DRIVING SUBSTRATES AND DISPLAY PANELS

CROSS REFERENCE TO RELATED APPLICATIONS

This application is a national Stage of International Application No. PCT/CN2023/104223, filed on Jun. 29, 2023, which claims priority to and the benefit of Chinese Patent Application No. 202310700987.7, filed on Jun. 14, 2023. The disclosures of the aforementioned applications are incorporated herein by reference in their entireties.

FIELD OF INVENTION

The disclosure relates to the technical field of display, in particular to driving substrates and display panels.

BACKGROUND OF INVENTION

A thin film transistor (TFT) is widely used in a liquid crystal display device, an organic light-emitting diode display device, and the like. In addition, it can also be used in a micro light-emitting diode (LED) display device, an electronic paper, and the like.

A high electric field may generate between a channel region and a drain region of the TFT, in which hot carriers generate. The threshold voltage (Vth) of the TFT changes due to the influence of the hot carriers. The above-mentioned phenomenon can be alleviated by forming a lightly doped drain (LDD) region between the channel region and the drain region for the transition of resistance.

In the research and practice of the related art, the inventor of the present disclosure found that, a top gate in the top gate type TFT is usually used as a mask, the source region and the drain region are formed by the plasma treatment on the oxide semiconductor, and the LDD region is formed by contacting with a silicon nitride film. That is, the length of the channel depends on the length of the top gate.

SUMMARY

Embodiments of the present disclosure provide a driving substrate and a display panel, which can narrow a length of a channel of an active layer.

Embodiments of the present disclosure provide a driving substrate, which may include:

- a substrate; and
- a thin film transistor structure disposed on the substrate, in which the thin film transistor structure may include:
- an active layer disposed on the substrate and including a first contact part, a transition part, a channel, and a second contact part, in which the transition part may be disposed between the first contact part and the channel, and the second contact part may be disposed at a side of the channel away from the first contact part; a resistance value of the first contact part may be less than a resistance value of the transition part, and the resistance value of the transition part may be less than a resistance value of the channel;
- a gate insulation layer disposed on the active layer;
- a gate disposed on the gate insulation layer and including a first part and a second part connected to the first part, in which the first part may be disposed overlapping with the channel and used to block doped ions completely, and the second part may be disposed overlapping with the transition part and used to penetrate part of the doped ions; and
- a first electrode and a second electrode, in which the first electrode may be connected to the first contact part, and the second electrode may be connected to the second contact part.

Optionally, in some embodiments of the present disclosure, a compactness of the first part may be greater than a compactness of the second part.

Optionally, in some embodiments of the present disclosure, a thickness of the first part may be greater than a thickness of the second part.

Optionally, in some embodiments of the present disclosure, the gate may be a single film layer structure.

Optionally, in some embodiments of the present disclosure, the gate may include a first metal layer and a second metal layer, the first metal layer may be disposed on the gate insulation layer and block the channel and the transition part, and the second metal layer may be disposed on a side of the first metal layer away from the gate insulation layer and block the channel.

Optionally, in some embodiments of the present disclosure, a thickness of the first metal layer may be less than a thickness of the second metal layer.

Optionally, in some embodiments of the present disclosure, the gate may include a first metal layer and a second metal layer, the first metal layer may be disposed on the gate insulation layer and only block the channel, and the second metal layer may be disposed on a side of the first metal layer away from the gate insulation layer and block the channel and the transition part.

Optionally, in some embodiments of the present disclosure, the thickness of the first part may be greater than or equal to 250 nm, and the thickness of the second part may be greater than or equal to 10 nm and less than or equal to 100 nm.

Optionally, in some embodiments of the present disclosure, a mass ratio of the doped ions in the first contact part may be greater than a mass ratio of the doped ions in the transition part.

Optionally, in some embodiments of the present disclosure, the first electrode may be used to connect a light-emitting device, the channel may be directly connected to the second contact part, or another transition part may be connected between the channel and the second contact part.

Accordingly, embodiments of the present disclosure further provide a display panel, which may include the driving substrate described in any of the above-mentioned embodiments and a light-emitting device disposed on the driving substrate, the driving substrate may include:

- a substrate; and
- a thin film transistor structure disposed on the substrate, in which the thin film transistor structure may include:
- an active layer disposed on the substrate and including a first contact part, a transition part, a channel, and a second contact part, in which the transition part may be disposed between the first contact part and the channel, and the second contact part may be disposed at a side of the channel away from the first contact part; a resistance value of the first contact part may be less than a resistance value of the transition part, and the resistance value of the transition part may be less than a resistance value of the channel;
- a gate insulation layer disposed on the active layer;
- a gate disposed on the gate insulation layer and including a first part and a second part connected to the first part, in which the first part may be disposed overlapping with the channel and used to block doped ions completely, and the second part may be disposed overlapping with the transition part and used to penetrate part of the doped ions; and a first electrode and a second electrode, in which the first electrode may be connected to the first contact part, and the second electrode may be connected to the second contact part.

Optionally, in some embodiments of the present disclosure, a compactness of the first part may be greater than a compactness of the second part.

Optionally, in some embodiments of the present disclosure, a thickness of the first part may be greater than a thickness of the second part.

Optionally, in some embodiments of the present disclosure, the gate may be a single film layer structure.

Optionally, in some embodiments of the present disclosure, the gate may include a first metal layer and a second metal layer, the first metal layer may be disposed on the gate insulation layer and block the channel and the transition part, and the second metal layer may be disposed on a side of the first metal layer away from the gate insulation layer and block the channel.

Optionally, in some embodiments of the present disclosure, a thickness of the first metal layer may be less than a thickness of the second metal layer.

Optionally, in some embodiments of the present disclosure, the gate may include a first metal layer and a second metal layer, the first metal layer may be disposed on the gate insulation layer and only block the channel, and the second metal layer may be disposed on a side of the first metal layer away from the gate insulation layer and block the channel and the transition part.

Optionally, in some embodiments of the present disclosure, the thickness of the first part may be greater than or equal to 250 nm, and the thickness of the second part may be greater than or equal to 10 nm and less than or equal to 100 nm.

Optionally, in some embodiments of the present disclosure, a mass ratio of the doped ions in the first contact part may be greater than a mass ratio of the doped ions in the transition part.

Optionally, in some embodiments of the present disclosure, the first electrode may be used to connect a light-emitting device, the channel may be directly connected to the second contact part, or another transition part may be connected between the channel and the second contact part.

BENEFICIAL EFFECTS

Embodiments of the present disclosure provide a driving substrate, which includes a substrate and a thin film transistor structure. The thin film transistor structure is disposed on the substrate and includes an active layer, a gate insulation layer, a gate, a first electrode, and a second electrode. The active layer is disposed on the substrate and includes a first contact part, a transition part, a channel, and a second contact part. The transition part is disposed between the first contact part and the channel, and the second contact part is disposed at a side of the channel away from the first contact part. A resistance value of the first contact part is less than a resistance value of the transition part, and the resistance value of the transition part is less than a resistance value of the channel. The gate insulation layer is disposed on the active layer. The gate is disposed on the gate insulation layer and includes a first part and a second part connected to the first part. The first part is disposed overlapping with the channel and used to completely block doped ions, and the second part is disposed overlapping with the transition part and used to penetrate part of the doped ions. The first electrode is connected to the first contact part, and the second electrode is connected to the second contact part.

The embodiments of the present disclosure use the first part of the gate to block the channel, and the second part to block the transition part, so that some doped ions penetrate through the second part and enter the transition part, while the doped ions corresponding to the channel region are completely blocked by the first part during an ion implantation process. Therefore, compared to the technology in the related art in which the gate is used as a mask, the channel in the embodiments of the present disclosure can be narrower by using the gate as the mask to achieve the doping of the transition part under the mask, which can improve the stability of the threshold voltage of the thin film transistor.

DETAILED DESCRIPTION OF EMBODIMENTS

Figure 1:
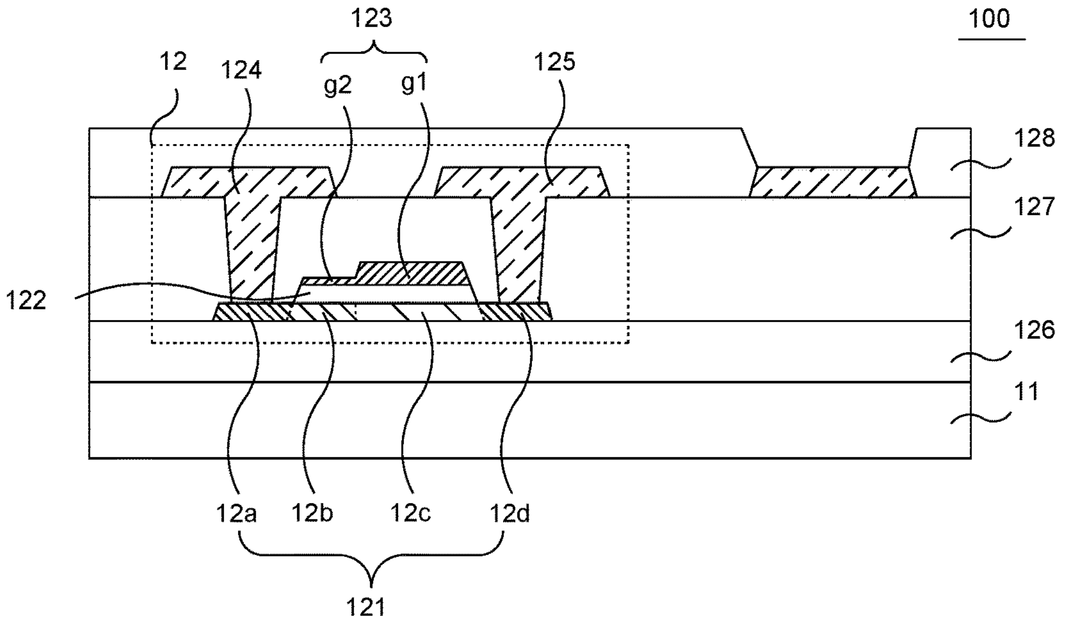
FIG. 1 is a schematic structural diagram of a driving substrate according to a first embodiment of the present disclosure.

In combination with drawings in embodiments of the present disclosure, technical solutions in the embodiments of the present disclosure will be described clearly and completely. Apparently, the described embodiments are only part of the embodiments of the present disclosure, not all of them. Based on the embodiments of the present disclosure, all other embodiments obtained by those skilled in the art without creative effort belong to a scope of the present disclosure. In addition, it should be understood that specific embodiments described herein are only used to explain and interpret the present disclosure and are not used to limit the present disclosure. In the present disclosure, location terms used, such as “up” and “down”, generally refer to up and down in actual using or working state of devices, in particular drawing directions in the drawings, unless otherwise described; terms “inside” and “outside” refer to outlines of the devices.

The embodiments of the present disclosure provide a driving substrate and a display panel. It should be noted that the driving substrate can be applied in a liquid crystal display panel, an organic light emitting diode display panel, a micro light emitting diode display panel, an electronic paper, or the like. The following description provides a detailed explanation. It should be noted that the description order of the following embodiments does not serve as a limitation on a preferred order of the embodiments.

Referring to FIG. 1, a first embodiment of the present disclosure provides a driving substrate 100, which includes a substrate 11 and a thin film transistor structure 12. The thin film transistor structure 12 is disposed on the substrate 11.

The thin film transistor structure 12 includes an active layer 121, a gate insulation layer 122, a gate 123, a first electrode 124, and a second electrode 125.

The active layer 121 is disposed on the substrate 11. The active layer 121 includes a first contact part 12*a*, a transition part 12*b*, a channel 12*c*, and a second contact part 12*d*. The transition part 12*b* is disposed between the first contact part 12*a* and the channel 12*c*. The second contact part 12*d* is disposed at a side of the channel 12*c* away from the first contact part 12*a*. A resistance value of the first contact part 12*a* is less than a resistance value of the transition part 12*b*. The resistance value of transition part 12*b* is less than a resistance value of the channel 12*c*.

The gate insulation layer 122 is disposed on the active layer 121. The gate 123 is disposed on the gate insulation layer 122.

The gate 123 includes a first part g1 and a second part g2 connected to the first part g1. The first part g1 is disposed overlapping with the channel 12*c*. The second part g2 is disposed overlapping with the transition part 12*b*. The first part of g1 is used to block doped ions completely. The second part g2 is used to penetrate some of the doped ions.

The first electrode 124 is connected to the first contact part 12*a*. The second electrode 125 is connected to the second contact part 12*d*.

This embodiment uses the first part g1 of the gate 123 to block the channel 12*c*, and the second part g2 to block the transition part 12*b*, so that some doped ions penetrate through the second part g2 and enter the transition part 12*b*, while the doped ions corresponding to the region where the channel 12*c* is located are completely blocked by the first part g1 during an ion implantation process. Therefore, compared to the technology in the related art in which the gate is used as a mask, the channel 12*c* in this embodiment can be narrower by using the gate 123 as the mask to achieve the doping of the transition part 12*b* under the mask, which improves the stability of the threshold voltage of the thin film transistor.

Optionally, in the first embodiment, a thickness of the first part g1 is greater than a thickness of the second part g2. It can be understood that, as the thickness of the film layer increases, the effect of the film layer for blocking the doped ions is better. Thus, this embodiment can realize the ion doping under the film layer through the thinner second part g2, and the complete blocking of the doped ions through the thicker first part g1.

Optionally, the gate 123 is a single film layer structure.

It should be noted that the gate 123 is the single film layer structure, and the first part g1 and the second part g2 can be made of the same material or different materials.

When the first part g1 and the second part g2 of the gate 123 are made of the same material, the formation of the first part g1 and the second part g2 can be realized by using a halftone or grayscale mask. The gate 123 of the first embodiment is designed to be the single film layer structure, which can simplify the preparation process of the gate 123.

When the first part g1 and the second part g2 of the gate 123 are made of different materials, the first part g1 and the second part g2 are formed separately.

Optionally, the thickness of the first part g1 is greater than or equal to 250 nm. The thickness of the second part g2 is greater than or equal to 10 nm and less than or equal to 100 nm.

It can be understood that in the driving substrate for display panels, the gate 123 is generally prepared by a physical vapor deposition, so the compactness of the gate 123 is relatively high. Therefore, in the general preparation process, when the thickness of the first part g1 is greater than 250 nm, doped ions can be avoided from penetrating through the first part g1. When the thickness of the second part g2 is less than 100 nm, the permeability of the doped ions can be ensured, which can improve the doping efficiency. When the thickness of the second part g2 is greater than 10 nm, it can be avoided that the resistance of the transition part 12*b* is too low to tend to be same as the resistance of the first contact part 12*a*. In a condition that the resistance of the transition part 12*b* and the resistance of the first contact part 12*a* tend to be same, it may reduce the stability of the threshold voltage of the thin film transistor.

Optionally, the thickness of the first part of g1 may be 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, or 1000 nm. The thickness of the second part g2 may be 100 nm, 90 nm, 80 nm, 70 nm, 60 nm, 50 nm, 40 nm, 30 nm, 20 nm, or 10 nm.

Optionally, a material of the gate 123 may be copper (Cu), aluminum (Al), molybdenum (Mo), titanium (Ti), nickel (Ni), zinc (Zn), chromium (Cr), and/or alloy composed of any of the aforementioned metal.

Optionally, the gate insulation layer 122 is formed by multiple inorganic layers stacked in an alternation form. For example, the gate insulation layer 122 can be a double layer formed by stacking at least one inorganic layer including silicon oxide, silicon nitride, silicon nitride, alumina, magnesium oxide, and/or titanium oxide, or a multi-layer formed by alternately stacking at least one inorganic layer including silicon oxide, silicon nitride, silicon nitride, aluminum oxide, magnesium oxide, and/or titanium oxide. However, this disclosure is not limited to this. The gate insulation layer 122 can be a single inorganic layer containing the aforementioned insulation materials.

Optionally, a material of the active layer 121 may be monocrystalline silicon, polycrystalline silicon (poly-Si), and/or oxide semiconductor. The oxide semiconductor may include one of titanium, hafnium, zirconium, aluminum, tantalum, germanium, zinc, gallium, tin, indium oxide, and/or composite oxide thereof (such as indium gallium zinc oxide, indium zinc oxide, zinc tin oxide, indium gallium oxide, indium tin oxide, indium zirconium oxide, indium zirconium zinc oxide, indium zirconium tin oxide, indium zirconium gallium oxide, indium aluminum oxide, indium zinc aluminum oxide, indium tin aluminum oxide, indium aluminum gallium oxide, indium tantalum oxide, indium tantalum zinc oxide, indium tantalum tin oxide, indium tantalum gallium oxide, indium germanium oxide, indium germanium zinc oxide, indium germanium tin oxide, indium germanium gallium oxide, titanium indium zinc oxide, and hafnium indium zinc oxide).

Optionally, a mass ratio of the doped ions in the first contact part 12*a* is greater than a mass ratio of the doped ions in the transition part 12*b*, so that the resistance value of the first contact part 12*a* is less than the resistance value of the transition part 12*b*.

Moreover, a mass ratio of the doped ions in the second contact part 12*d* is greater than the mass ratio of the doped ions in the transition part 12*b*, so that the resistance value of the second contact part 12*d* is less than the resistance value of the transition part 12*b*.

Optionally, in the first embodiment, the first electrode 124 is used to connect a light-emitting device, and the channel 12*c* is directly connected to the second contact 12*d*.

Optionally, the driving substrate 100 may further include a buffer layer 126 disposed between the active layer 121 and the substrate 11.

Optionally, the driving substrate 100 may further include an interlayer dielectric layer 127 and a passivation layer 128. The interlayer dielectric layer 127 covers the gate 123, the active layer 121, and the substrate 11. The first electrode 124 and the second electrode 125 are disposed on the interlayer dielectric layer 127. The first electrode 124 is connected to the first contact part 12*a*, and the second electrode 125 is connected to the second contact part 12*d*. The passivation layer 128 covers the first electrode 124 and the second electrode 125.

In some embodiments, the interlayer dielectric layer 127 of the driving substrate 100 can be omitted. That is, the first electrode 124 is directly connected to the first contact part 12*a*, and the second electrode 125 is directly connected to the second contact part 12*d*.

A preparation process of the driving substrate 100 in the first embodiment is as follows.

Step B11, the buffer layer 126, a semiconductor layer 12*k*, the gate insulation layer 122, and the gate 123 are formed on the substrate 11 sequentially.

The first part g1 and the second part g2 is formed by using a halftone mask, and the thickness of the first part g1 is greater than the thickness of the second part g2. The semiconductor layer 12*k* includes a channel region corresponding to the first part g1, a transition region corresponding to the second part g2, and a first electrode region and a second electrode region exposed outside the gate 123.

Subsequently, proceed to step B12.

Figure 2:
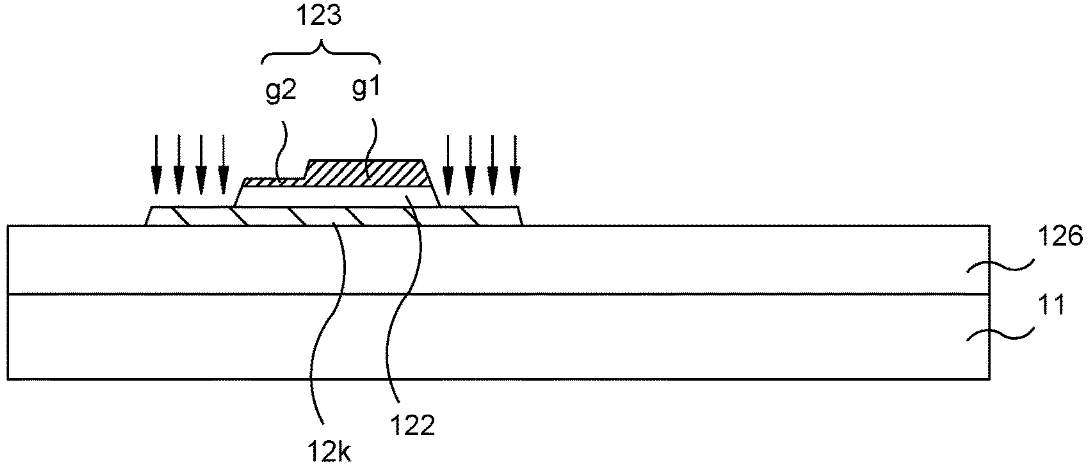
FIG. 2 is a schematic diagram of a step B12 of a preparation method of a driving substrate according to the first embodiment of the present disclosure.

Referring to FIG. 2, at step B12, a conductivity treatment is performed on the first electrode region and the second electrode region of the semiconductor layer 12*k* by using the gate 123 as the mask. Optionally, oxygen vacancy with high concentration is formed by bombarding the first electrode region and the second electrode region of the semiconductor layer 12*k* with Ar, thereby achieving conductivity. Both of the sheet resistance of the first electrode region and the sheet resistance of the second electrode region of the semiconductor layer 12*k* range from 300Ω to 3000Ω, such as 300 Ω, 1000 Ω, 2000Ω, or 3000Ω.

Subsequently, proceed to step B13.

Figure 3:
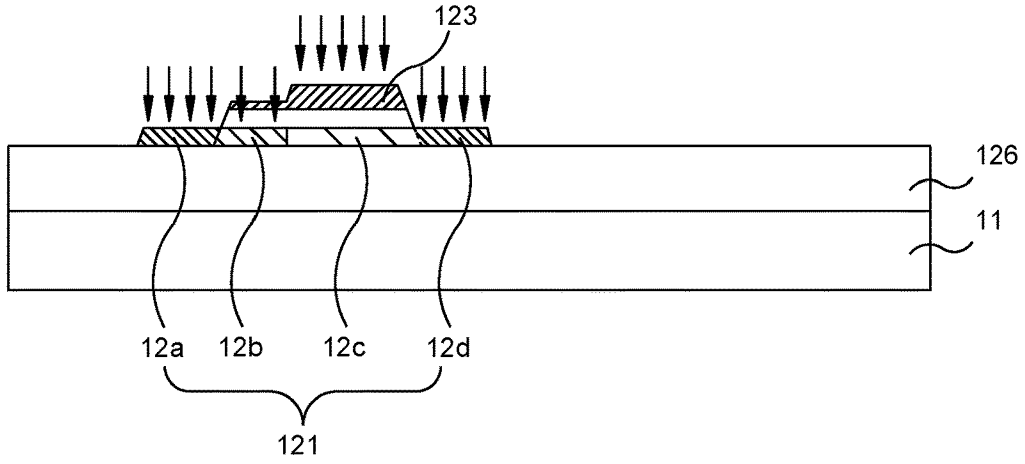
FIG. 3 is a schematic diagram of a step B13 of the preparation method of the driving substrate according to the first embodiment of the present disclosure.

Referring to FIG. 3, at step B13, the gate 123 is continued to be used as the mask, an ion implantation treatment is performed on the first electrode region, the second electrode region, and the transition region of the semiconductor layer 12*k* to form the first contact part 12*a*, the transition part 12*b*, the channel 12*c*, and the second contact part 12*d*.

Optionally, the doping ions can be boron (B), phosphorus (P), or the like.

Subsequently, proceed to step B14, in which the first electrode 124 and the second electrode 125 are formed on the substrate. The first electrode 124 is connected to the first contact part 12*a*, and the second electrode 125 is connected to the second contact part 12*d*.

Thus, a partial preparation process of the driving substrate 100 in the first embodiment is completed.

Figure 4:
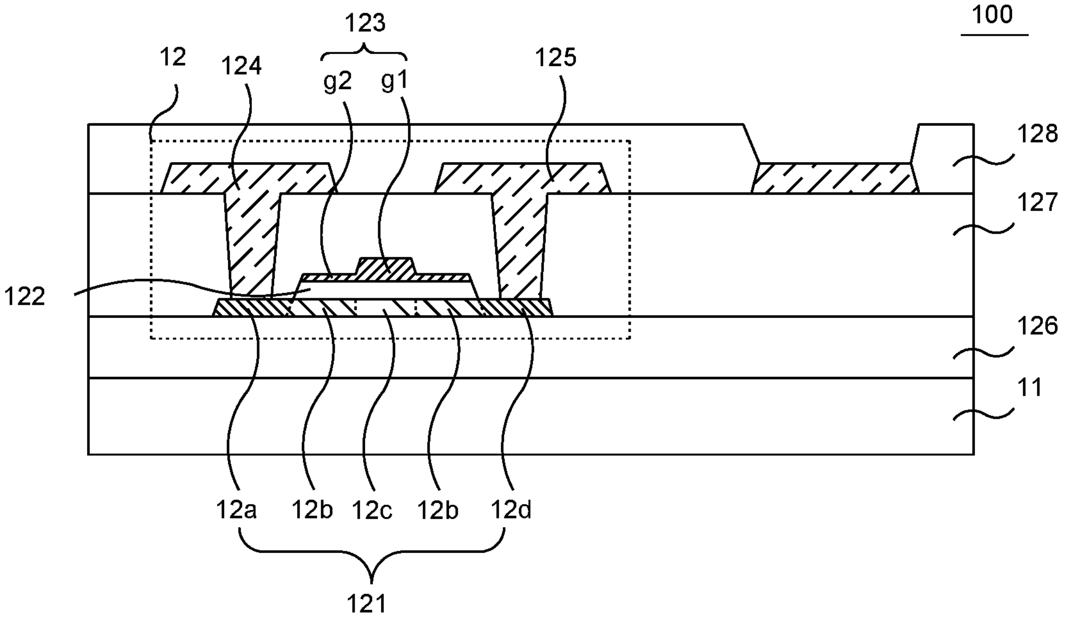
FIG. 4 is a schematic structural diagram of a driving substrate according to a second embodiment of the present disclosure.

Referring to FIG. 4, the driving substrate 100 in a second embodiment is different from the first embodiment in that another transition part 12*b* is connected between the channel 12*c* and the second contact part 12*d*.

That is, compared to the driving substrate 100 in the first embodiment, the gate 123 of the driving substrate 100 in the second embodiment includes two second parts g2 to block two transition parts 12*b*, respectively.

Compared to the first embodiment, the second embodiment uses two transition parts 12*b* to further narrow the length of the channel 12*c* and improve the stability of the threshold voltage of the thin film transistor.

Figure 5:
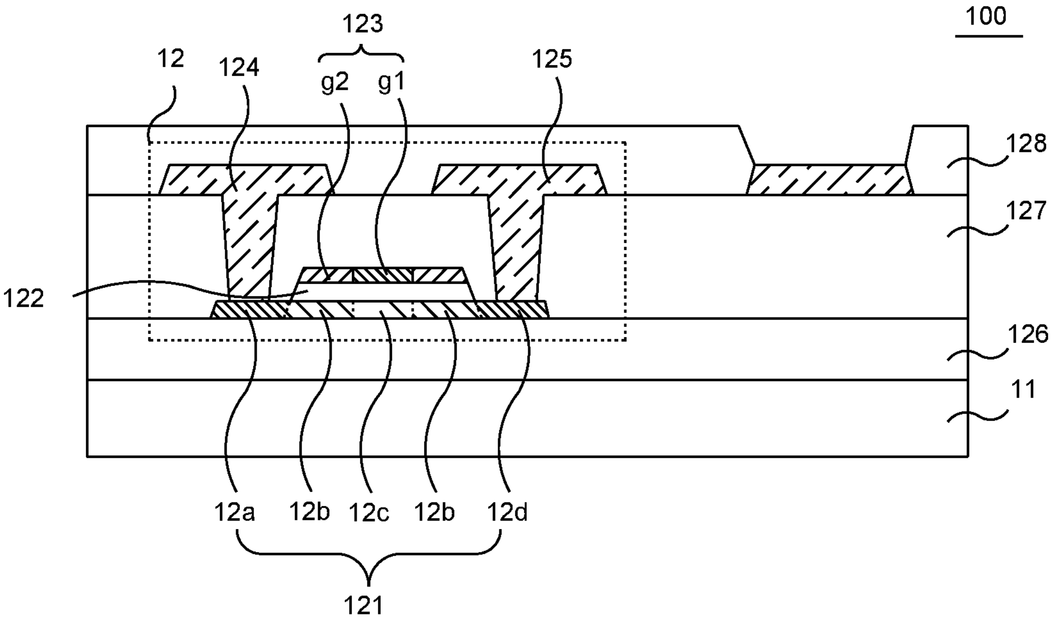
FIG. 5 is a schematic structural diagram of a driving substrate according to a third embodiment of the present disclosure.

Referring to FIG. 5, the driving substrate 100 in a third embodiment is different from any of the above-mentioned embodiments in that the compactness of the first part g1 is greater than the compactness of the second part g2.

Optionally, the thickness of the first part g1 can be equal to the thickness of the second part g2. The compactness of the film layer can be adjusted by adjusting the parameters of the vapor deposition process, such as the bombardment energy or the deposition rate, which will not be described here.

Figure 6:
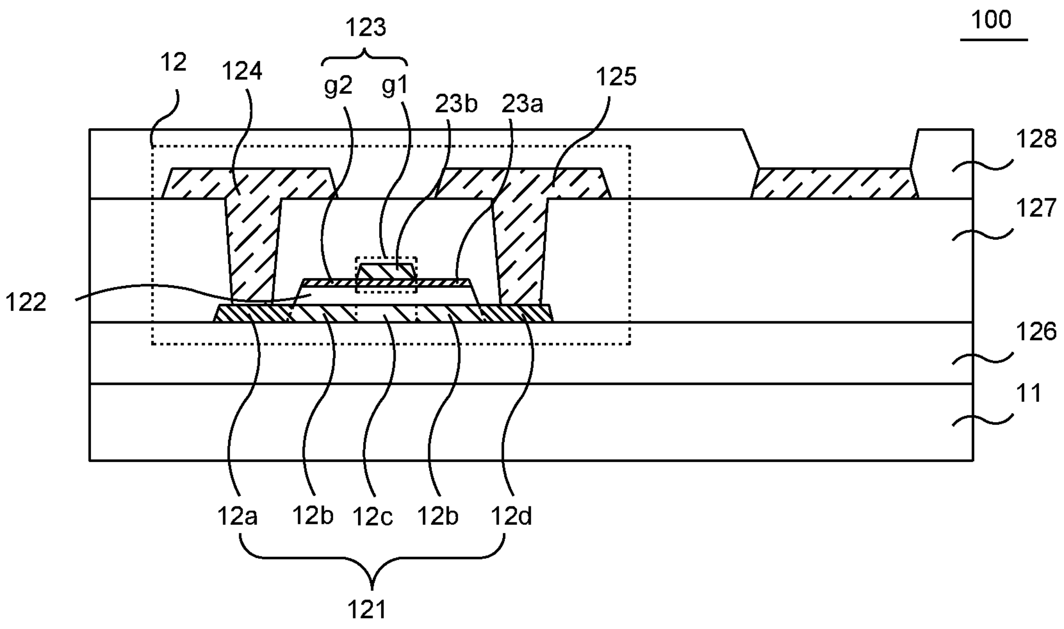
FIG. 6 is a schematic structural diagram of a driving substrate according to a fourth embodiment of the present disclosure.

Referring to FIG. 6, the driving substrate 100 in a fourth embodiment is different from any of the above-mentioned embodiments in that the gate 123 includes a first metal layer 23*a* and a second metal layer 23*b*. The first metal layer 23*a* is disposed on the gate insulation layer 122. The first metal layer 23*a* blocks the channel 12*c* and the transition part 12*b*. The second metal layer 23*b* is disposed on a side of the first metal layer 23*a* away from the gate insulation layer 122. The second metal layer 23*b* blocks the channel 12*c*.

Optionally, the first metal layer 23*a* is disposed between the second metal layer 23*b* and the gate insulation layer 122, which improves the adhesion between the gate 123 and the gate insulation layer 122.

Optionally, a thickness of the first metal layer 23*a* is less than a thickness of the second metal layer 23*b*. Under the limitation of a certain thickness, because the conductivity of the first metal layer 23*a* is less than the conductivity of the second metal layer 23*b*, the design of a thicker second metal layer 23*b* can increase the conductivity of the gate 123 and improve the blocking effect of the first part g1 for the doped ions; the design of a thinner first metal layer 23*a* is used to penetrate part of the doped ions. Moreover, an area of the first metal layer 23*a* is larger, which can satisfy the requirements for improving the adhesion of the gate 123.

Optionally, a material of the first metal layer 23*a* includes at least one of molybdenum and titanium, and a material of the second metal layer 23*b* includes at least one of copper and aluminum.

For example, when the material of the first metal layer 23*a* is titanium or alloy composed of molybdenum and titanium, the thickness of the first metal layer 23*a* may range from 10 nm to 50 nm, such as 10 nm, 20 nm, 30 nm, 40 nm, or 50 nm.

When the material of the second metal layer 23*b* is copper or aluminum, the thickness of the second metal layer 23*b* may range from 350 nm to 1000 nm, such as 350 nm, 400 nm, 500 nm, 600 nm, 700 nm, 800 nm, 900 nm, or 1000 nm. If a strengthening process is used to increase the compactness of the second metal layer 23*b*, the thickness required by the second metal layer 23*b* can further be reduced. Moreover, the thickness of the second metal layer 23*b* can be less than 1000 nm to avoid a high terrain caused by a thicker thickness of the gate 123.

In some embodiments, the gate 123 can be a stacked structure with three layers, such as Ti/Al/Ti, Mo/Al/Mo, Ti/Cu/Ti, Mo/Cu/Mo, MoTi alloy/Al/MoTi alloy, or MoTi alloy/Cu/MoTi alloy.

Figure 7:
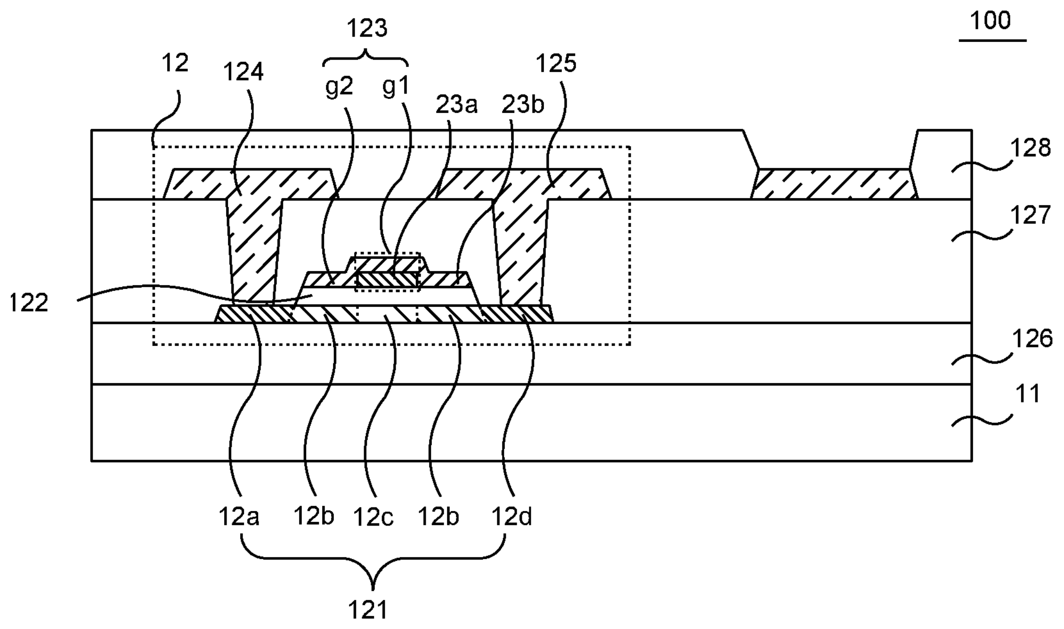
FIG. 7 is a schematic structural diagram of a driving substrate according to a fifth embodiment of the present disclosure.

Referring to FIG. 7, the driving substrate 100 in a fifth embodiment is different from any of the above-mentioned embodiments in that the gate 123 includes a first metal layer 23*a* and a second metal layer 23*b*. The first metal layer 23*a* is disposed on the gate insulation layer 122. The first metal layer 23*a* only blocks the channel 12*c*. The second metal layer 23*b* is disposed on a side of the first metal layer 23*a* away from the gate insulation layer 122. The second metal layer 23*b* blocks the channel 12*c* and the transition part 12*b*.

This embodiment uses a multi-layer structure of the gate 123 to facilitate the control to the thicknesses of the first part g1 and the second part g2, so as to realize the precise regulation of the resistance value of the transition part 12*b*.

It should be noted that, in this embodiment, the thickness of the first metal layer 23*a* cannot be too large, so as to avoid the risk of disconnection of the second metal layer 23*b* covering the first metal layer 23*a* in a condition of a thicker thickness.

Figure 8:
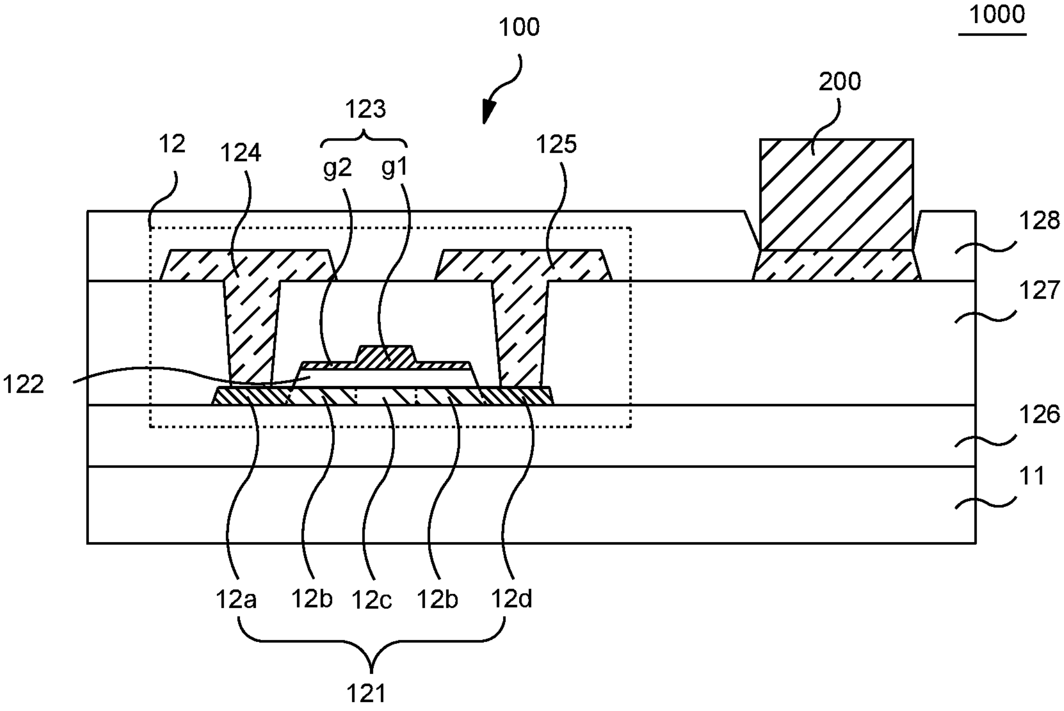
FIG. 8 is a schematic structural diagram of a display panel according to one or more embodiments of the present disclosure.

Referring to FIG. 8, correspondingly, the embodiments of the present disclosure further provide a display panel 1000, which includes the driving substrate 100 described in any of the above-mentioned embodiments.

Optionally, the display panel 1000 can be a liquid crystal display panel, an organic light-emitting diode display panel, a micro light-emitting diode display panel, a quantum dot light-emitting diode display panel, or the like.

As shown in FIG. 8, in this embodiment, the display panel 1000 being the micro light-emitting diode panel is taken as an example for illustration.

The display panel 1000 further includes the light-emitting device 200 disposed on the driving substrate 100.

The structure of the driving substrate 100 of the display panel 1000 in this embodiment is similar or same as the structure of the driving substrate 100 in any of the above-mentioned embodiments, which will not be repeated here.

The display panel 1000 of this embodiment uses the first part g1 of the gate 123 to block the channel 12*c*, and the second part g2 to block the transition part 12*b*, so that some doped ions penetrate through the second part g2 and enter the transition part 12*b*, while the doped ions corresponding to the region where the channel 12*c* is located are completely blocked by the first part g1 during the ion implantation process. Therefore, compared to the technology in the related art in which the gate is used as a mask, the channel 12*c* in this embodiment can be narrower by using the gate 123 as the mask to achieve the doping of the transition part 12*b* under the mask, which improves the stability of the threshold voltage of the thin film transistor.

The driving substrate and the display device provided by the embodiments of the present disclosure are described in detail. In this paper, specific embodiments are used to illustrate a principle and implementation modes of the present disclosure. The description of the above-mentioned embodiments is only used to help understand methods and a core idea of the present disclosure. At the same time, for those skilled in the art, of the idea of the present disclosure, there will be changes in specific implementation modes and a scope of the present disclosure. In conclusion, contents of the specification should not be interpreted as a limitation of the present disclosure.

What is claimed is:

1. A driving substrate, comprising:

a substrate; and a thin film transistor structure disposed on the substrate, wherein the thin film transistor structure comprises:

an active layer disposed on the substrate and comprising a first contact part, a first transition part, a channel, and a second contact part, wherein the first transition part is disposed between the first contact part and the channel, and the second contact part is disposed at a side of the channel away from the first contact part; wherein a resistance value of the first contact part is less than a resistance value of the first transition part, and the resistance value of the first transition part is less than a resistance value of the channel;

a gate insulation layer disposed on the active layer;

a gate disposed on the gate insulation layer and comprising a first part and at least one second part connected to the first part, wherein the first part is disposed overlapping with the channel and used to block doped ions completely, and the second part is disposed overlapping with the first transition part and used to penetrate part of the doped ions; and a first electrode and a second electrode, wherein the first electrode is connected to the first contact part, and the second electrode is connected to the second contact part;

wherein the gate comprises a first metal layer and a second metal layer stacked in a thickness direction of the driving substrate, the first metal layer is disposed on the gate insulation layer, and the second metal layer is disposed on a side of the first metal layer away from the gate insulation layer; the first metal layer is disposed overlapping with the channel, the second metal layer covers both the channel and the first transition part, the first part consists of a portion of the second metal layer covering the channel and the first metal layer, and the second part consists of a portion of the second metal layer covering the first transition part.

2. The driving substrate of claim 1, wherein a compactness of the first part is greater than a compactness of the second part.

3. The driving substrate of claim 1, wherein a thickness of the first part is greater than a thickness of the second part.

4. The driving substrate of claim 1, wherein a thickness of the first metal layer is less than a thickness of the second metal layer.

5. The driving substrate of claim 1, wherein the thickness of the first part is greater than or equal to 250 nm, and the thickness of the second part is greater than or equal to 10 nm and less than or equal to 100 nm.

6. The driving substrate of claim 1, wherein a mass ratio of the doped ions in the first contact part is greater than a mass ratio of the doped ions in the first transition part.

7. The driving substrate of claim 1, wherein the first electrode is used to connect a light-emitting device, and the channel is directly connected to the second contact part.

8. The driving substrate of claim 1, wherein the second metal layer covers an upper surface and a side surface of the first metal layer, and the portion of the second metal layer covering the first transition part is in contact with the first transition part.

9. The driving substrate of claim 1, wherein the gate comprises two second parts, the channel further comprises a second transition part disposed between the channel and the second contact part, and the two second parts correspond to the first transition part and the second transition part, respectively.

10. The driving substrate of claim 1, wherein the first metal layer comprises at least one of molybdenum and titanium, and the second metal layer comprises at least one of copper and aluminum.

11. The driving substrate of claim 1, wherein a material of the first metal layer comprises titanium or an alloy of molybdenum and titanium, and the first metal layer has a thickness of 10 nm to 50 nm.

12. The driving substrate of claim 1, wherein a material of the second metal layer comprises copper or aluminum, and the second metal layer has a thickness of 350 nm to 1000 nm.

13. The driving substrate of claim 1, wherein a mass ratio of the doped ions in the second contact part is greater than a mass ratio of the doped ions in the first transition part.

14. A display panel, comprising a driving substrate and a light emitting device disposed on the driving substrate, wherein the driving substrate comprises:

a substrate; and a thin film transistor structure disposed on the substrate, wherein the thin film transistor structure comprises:

an active layer disposed on the substrate and comprising a first contact part, a first transition part, a channel, and a second contact part, wherein the first transition part is disposed between the first contact part and the channel, and the second contact part is disposed at a side of the channel away from the first contact part; wherein a resistance value of the first contact part is less than a resistance value of the first transition part, and the resistance value of the first transition part is less than a resistance value of the channel;

a gate insulation layer disposed on the active layer;

a gate disposed on the gate insulation layer and comprising a first part and a second part connected to the first part, wherein the first part is disposed overlapping with the channel and used to block doped ions completely, and the second part is disposed overlapping with the first transition part and used to penetrate part of the doped ions; and a first electrode and a second electrode, wherein the first electrode is connected to the first contact part, and the second electrode is connected to the second contact part;

wherein the gate comprises a first metal layer and a second metal layer stacked in a thickness direction of the driving substrate, the first metal layer is disposed on the gate insulation layer, and the second metal layer is disposed on a side of the first metal layer away from the gate insulation layer; the first metal layer is disposed overlapping with the channel, the second metal layer covers both the channel and the first transition part, the first part consists of a portion of the second metal layer covering the channel and the first metal layer, and the second part consists of a portion of the second metal layer covering the first transition part.

15. The display panel of claim 14, wherein a compactness of the first part is greater than a compactness of the second part.

16. The display panel of claim 14, wherein a thickness of the first part is greater than a thickness of the second part.

17. The display panel of claim 14, wherein a thickness of the first metal layer is less than a thickness of the second metal layer.

18. The display panel of claim 14, wherein the thickness of the first part is greater than or equal to 250 nm, and the thickness of the second part is greater than or equal to 10 nm and less than or equal to 100 nm.

19. The display panel of claim 14, wherein a mass ratio of the doped ions in the first contact part is greater than a mass ratio of the doped ions in the first transition part.

20. The display panel of claim 14, wherein the first electrode is used to connect a light-emitting device, the channel is directly connected to the second contact part; or wherein a second transition part is connected between the channel and the second contact part, and the second transition part has a same structure as the first transition part.

* * * * *